US009425249B2

(12) United States Patent
Norman

(10) Patent No.: US 9,425,249 B2
(45) Date of Patent: Aug. 23, 2016

(54) COINCIDENT SITE LATTICE-MATCHED GROWTH OF SEMICONDUCTORS ON SUBSTRATES USING COMPLIANT BUFFER LAYERS

(75) Inventor: Andrew Norman, Evergreen, CO (US)

(73) Assignee: Alliance for Sustainable Energy, LLC, Golden, CA (US)

( * ) Notice: Subject to any disclaimer, the term of this patent is extended or adjusted under 35 U.S.C. 154(b) by 504 days.

(21) Appl. No.: 13/990,743

(22) PCT Filed: Dec. 1, 2010

(86) PCT No.: PCT/US2010/058535
§ 371 (c)(1),
(2), (4) Date: Aug. 2, 2013

(87) PCT Pub. No.: WO2012/074524
PCT Pub. Date: Jun. 7, 2012

(65) Prior Publication Data
US 2013/0333751 A1    Dec. 19, 2013

(51) Int. Cl.
*H01L 31/0264* (2006.01)
*H01L 29/04* (2006.01)
(Continued)

(52) U.S. Cl.
CPC ............ *H01L 29/04* (2013.01); *H01L 21/0242* (2013.01); *H01L 21/02365* (2013.01);
(Continued)

(58) Field of Classification Search
CPC .................. H01L 21/02381; H01L 21/02395; H01L 21/0242; H01L 21/02439; H01L 21/02491; H01L 21/02502; H01L 21/02521; H01L 21/02365; H01L 31/076; H01L 31/1852; H01L 31/036; H01L 31/056; H01L 31/0725; H01L 33/007; H01L 33/12

USPC ........................................ 136/258, 260, 261
See application file for complete search history.

(56) References Cited

U.S. PATENT DOCUMENTS

| 4,136,207 A | 1/1979 | Bender |
| 5,164,359 A | 11/1992 | Calviello et al. |

(Continued)

FOREIGN PATENT DOCUMENTS

| WO | 03084886 | 10/2003 |
| WO | 2004022820 | 3/2004 |

(Continued)

OTHER PUBLICATIONS

Macfarlane et al., Nanoparticle Superlattice Engineering with DNA, Science, vol. 334, pp. 204-208 (2011).*

(Continued)

*Primary Examiner* — Jayne Mershon
(74) *Attorney, Agent, or Firm* — Suzanne C. Walts

(57) ABSTRACT

A method of producing semiconductor materials and devices that incorporate the semiconductor materials are provided. In particular, a method is provided of producing a semiconductor material, such as a III-V semiconductor, on a silicon substrate using a compliant buffer layer, and devices such as photovoltaic cells that incorporate the semiconductor materials. The compliant buffer material and semiconductor materials may be deposited using coincident site lattice-matching epitaxy, resulting in a close degree of lattice matching between the substrate material and deposited material for a wide variety of material compositions. The coincident site lattice matching epitaxial process, as well as the use of a ductile buffer material, reduce the internal stresses and associated crystal defects within the deposited semiconductor materials fabricated using the disclosed method. As a result, the semiconductor devices provided herein possess enhanced performance characteristics due to a relatively low density of crystal defects.

10 Claims, 9 Drawing Sheets

(51) Int. Cl.

| | | |
|---|---|---|
| *H01L 21/02* | (2006.01) | |
| *H01L 31/036* | (2006.01) | |
| *H01L 31/076* | (2012.01) | |
| *H01L 31/18* | (2006.01) | |
| *H01L 33/00* | (2010.01) | |
| *H01L 31/0725* | (2012.01) | |
| *H01L 33/26* | (2010.01) | |
| *H01L 31/056* | (2014.01) | |
| H01L 33/12 | (2010.01) | |

(52) U.S. Cl.
CPC .... *H01L21/02381* (2013.01); *H01L 21/02395* (2013.01); *H01L 21/02439* (2013.01); *H01L 21/02491* (2013.01); *H01L 21/02502* (2013.01); *H01L 21/02521* (2013.01); *H01L 31/036* (2013.01); *H01L 31/056* (2014.12); *H01L 31/076* (2013.01); *H01L 31/0725* (2013.01); *H01L 31/1852* (2013.01); *H01L 33/007* (2013.01); *H01L 33/26* (2013.01); *H01L 33/12* (2013.01); *Y02E 10/52* (2013.01); *Y02E 10/544* (2013.01); *Y02E 10/548* (2013.01)

(56) References Cited

U.S. PATENT DOCUMENTS

| | | | |
|---|---|---|---|
| 5,406,123 | A | 4/1995 | Narayan |
| 5,741,724 | A * | 4/1998 | Ramdani ............ H01L 33/007 |
| | | | 117/89 |
| 5,793,061 | A | 8/1998 | Ohuchi et al. |
| 5,796,771 | A | 8/1998 | DenBaars et al. |
| 6,281,426 | B1 | 8/2001 | Olson et al. |
| 6,340,788 | B1 * | 1/2002 | King .................. H01J 37/3023 |
| | | | 136/255 |
| 6,498,050 | B2 | 12/2002 | Fugimoto |
| 6,518,077 | B2 | 2/2003 | Narayan et al. |
| 6,605,486 | B2 | 8/2003 | Fugimoto |
| 6,759,139 | B2 | 7/2004 | Kunisato et al. |
| 6,844,084 | B2 | 1/2005 | Kokta et al. |
| 6,951,819 | B2 | 10/2005 | Iles et al. |
| 6,955,985 | B2 | 10/2005 | Narayan |
| 7,012,283 | B2 | 3/2006 | Tsuda et al. |
| 7,122,733 | B2 | 10/2006 | Narayanan et al. |
| 7,122,734 | B2 * | 10/2006 | Fetzer .................. H01L 31/184 |
| | | | 136/252 |
| 7,211,836 | B2 | 5/2007 | Udagawa |
| 7,220,324 | B2 | 5/2007 | Baker et al. |
| 7,323,764 | B2 | 1/2008 | Wallis |
| 7,390,684 | B2 | 6/2008 | Izuno et al. |
| 7,598,108 | B2 | 10/2009 | Li et al. |
| 7,601,215 | B1 | 10/2009 | Wang |
| 7,615,400 | B2 | 11/2009 | Goto et al. |
| 8,507,365 | B2 | 8/2013 | Norman et al. |
| 8,575,471 | B2 | 11/2013 | Norman et al. |
| 8,961,687 | B2 | 2/2015 | Norman et al. |
| 9,041,027 | B2 * | 5/2015 | Ptak .................. H01L 21/0242 |
| | | | 257/103 |
| 2002/0144725 | A1 | 10/2002 | Jordan et al. |
| 2003/0015728 | A1 | 1/2003 | Bosco et al. |
| 2003/0162271 | A1 | 8/2003 | Zhang et al. |
| 2004/0079408 | A1 | 4/2004 | Fetzer et al. |
| 2004/0166681 | A1 | 8/2004 | Iles et al. |
| 2005/0124161 | A1 | 6/2005 | Rawdanowicz et al. |
| 2006/0060237 | A1 | 3/2006 | Leidholm et al. |
| 2006/0126688 | A1 | 6/2006 | Kneissl |
| 2006/0130745 | A1 | 6/2006 | Narayan |
| 2006/0162767 | A1 | 7/2006 | Mascarenhas et al. |
| 2006/0236923 | A1 * | 10/2006 | Kouvetakis ............ C30B 25/02 |
| | | | 117/108 |
| 2007/0243703 | A1 | 10/2007 | Pinnington et al. |
| 2008/0029151 | A1 | 2/2008 | McGlynn et al. |
| 2008/0067547 | A1 | 3/2008 | Bergman et al. |
| 2008/0191203 | A1 | 8/2008 | Fujioka et al. |
| 2008/0217622 | A1 | 9/2008 | Goyal |
| 2008/0230779 | A1 | 9/2008 | Goyal |
| 2008/0245409 | A1 | 10/2008 | Varghese et al. |
| 2008/0265255 | A1 | 10/2008 | Goyal |
| 2008/0308836 | A1 | 12/2008 | Nakahara et al. |
| 2009/0032799 | A1 | 2/2009 | Pan |
| 2009/0042344 | A1 | 2/2009 | Ye et al. |
| 2009/0044860 | A1 | 2/2009 | Pan et al. |
| 2009/0045393 | A1 | 2/2009 | Nakahara |
| 2009/0065047 | A1 | 3/2009 | Fiorenza et al. |
| 2009/0078311 | A1 | 3/2009 | Stan et al. |
| 2009/0087941 | A1 | 4/2009 | Goto et al. |
| 2009/0140296 | A1 | 6/2009 | Park et al. |
| 2009/0155952 | A1 | 6/2009 | Stan et al. |
| 2009/0229662 | A1 | 9/2009 | Stan et al. |
| 2009/0283793 | A1 | 11/2009 | Osawa et al. |
| 2010/0206537 | A1 | 8/2010 | Ikeda et al. |
| 2010/0212729 | A1 | 8/2010 | Hsu |
| 2010/0218813 | A1 | 9/2010 | Guha et al. |
| 2011/0048514 | A1 | 3/2011 | Norman et al. |
| 2011/0062446 | A1 | 3/2011 | Goyal |
| 2011/0147791 | A1 | 6/2011 | Norman et al. |

FOREIGN PATENT DOCUMENTS

| | | |
|---|---|---|
| WO | 2004025707 | 3/2004 |
| WO | 2006033858 | 3/2006 |
| WO | 2007025062 | 3/2007 |
| WO | 2008112115 | 4/2008 |
| WO | 2008112115 | 9/2008 |
| WO | 2009096931 | 8/2009 |
| WO | 2009096932 | 8/2009 |
| WO | 2009110872 A2 | 9/2009 |
| WO | 2009110872 A3 | 12/2009 |

OTHER PUBLICATIONS

Andrianov, et al., "Time-Resolved Photoluminescence of Polycrystalline GaN Layers of Metal Substrates", Semiconductors, vol. 36, No. 8, Aug. 2002, pp. 878-882.

As, et al., "Heteroepitaxy of Doped and Undoped Cubic Group III-Nitrides", physica status solidi (a), vol. 176, Nov. 1999, pp. 475-485.

Asahi, et al., "Strong Photoluminescence Emission from Polycrystalline GaN Grown on Metal Substrate by NH3 Source MBE", physica status solidi (a), vol. 188, No. 2, Dec. 2001, pp. 601-604.

Haxel, et al. "Rare Earth Elements—Critical Resources for High Technology", U.S. Geological Survey Fact Sheet 087-02, Nov. 2002, pp. 1-4.

Bailey, et al. "Thin Film Poly III-V Space Solar Cells", Proceedings of the 33rd IEEE PVSC, May 2007, pp. 1-5, San Diego, California.

Baker, et al., "Characterization of Plannar Semipolar Gallium Nitride Films on Spinel Substrates", Japanese Journal of Applied Physics, vol. 44, No. 29, Jul. 2005, pp. L920-L922.

Baur, et al., "Triple-Junction III-V Based Concentrator Solar Cells: Perspectives and Challenges", Journal of Solar Energy Engineering, vol. 129, Aug. 2007, pp. 258-265.

Bergh, et al., "The Promise and Challenge of Solid-State Lighting", Physics Today, Dec. 2001, pp. 42-47.

Oh, et al., "Epitaxial Growth and Characterization of GaAs/Al/GaAs Herterostructures", Surface Science, 1990, vol. 228, Apr. 1990, pp. 16-19.

Bhattacharya, et al., "Growth and characterization of GaAs/Al/GaAs heterostructures", Journal of Applied Physiology, vol. 67, No. 8, Apr. 15, 1990, pp. 3700-3705.

Cantoni, et al., "Reflection high-energy electron diffraction studies of epitaxial oxide seed-layer growth on rolling-assisted biaxially textured substrate Ni (001): The role of surface structure and chemistry", Applied Physics Letters, vol. 79, No. 8, Apr. 15, 1990, pp. 3700-3705.

Cho, et al., "Single-crystal-aluminum Schottky-barrier diodes prepared by molecular-beam epitaxy (MBE) on GaAs", Journal of Applied Physiology, vol. 49, No. 6, Jun. 1978, pp. 3328-3332.

Efimov, et al., "On an Unusual Azimuthal Orientational Relationship in the System Gallium Nitride Layer on Spinel Substrate", Crystallography Reports, 45, No. 2, Mar. 2000, pp. 312-317.

(56) References Cited

OTHER PUBLICATIONS

Feltrin, et al., "Material considerations for terawatt level deployment of photovoltaics", Renewable Energy, vol. 33 Issue 2, Feb. 2008, pp. 180-185.
Findikoglu, et al., "Aligned-Crystalline Silicon Films on Non-Single-Crystalline Substrates", Los Alamos National Laboratory publication, MRS, 2006, Report No. LA-UR-06-1165, pp. 1-11.
Freitas, Jr., et al., "Properties of epitaxial GaN on refractory metal substrates", Applied Physics Letters, 2007, vol. 90, Issue 9, Feb. 26, 2007, pp. 091910-1-091910-3.
Fritzemeier, et al., "Progress Toward High Efficiency Thin Film Photovoltaics", High-Performance PV—2007 Program Review Meeting, 2007, pp. 1-2.
Geisz, et al., "III-N-V semiconductors for solar photovoltaic applications", Semiconductor Science and Technology, vol. 17, Issue 8, Jul. 10, 2002, pp. 769-777.
Geisz, et al., "High-efficiency GaInP/GaAS/InGaAs triple-junction solar cells grown inverted with a metamorphic bottom junction", Applied Physics Letters, vol. 91, Issue 2, Jul. 9, 2007, pp. 023502-1-023502-3.
Geisz, et al., "40.8% efficient inverted triple-junction solar cell with two independently metamorphic junctions", Applied Physics Letters, vol. 93, Issue 12, Sep. 22, 2008, pp. 123505-1-123505-3.
George, et al., "Novel symmetry in the growth gallium nitride on magnesium aluminate substrates", Applied Physics Letters, vol. 68, No. 3, Jan. 15, 1996, pp. 337-339.
Goyal, et al., "The RABiTS Approach: Using Rolling-Assisted Biaxially Textured Substrates for High-Performance YBCO Superconductors", MRS Bulletin, Aug. 2004, pp. 552-561.
Haworth, et al., Investigation into the influence of buffer and nitrided layers on the initial stages of GaN growth on InSb (100), Applied Surface Science, vol. 166, Issues 1-4, Oct. 9, 2000, pp. 418-422
Hirata, et al., "Epitaxial growth of AlN films on single-crystalline Ta substrates", Journal of Solid State Chemistry, vol. 180, Issue 8, Aug. 2007, pp. 2335-2339.
Hu, et al., "Nucleation and growth of epitaxial $ZrB_2(0\ 0\ 0\ 1)$ on Si (1 1 1)", Journal of Crystal Growth, Jul. 1, 2004, vol. 267, Issues 1-4, pp. 554-563.
Inoue, et al., "Epitaxial growth of AlN on Cu (1 1 1) substrates using pulsed paser deposition", Journal of Crystal Growth, vol. 289, Issue 2, Apr. 2006, pp. 574-577.
Inoue, et al., "Epitaxial growth of GaN on copper substrates", Applied Physics Letters, Jun. 26, 2006, vol. 88, Issue 26, Jun. 26, 2006, pp. 261910-1-261910-3.
Khan, et al., "Cleaved cavity optically pumped InGaN—GaN laser grown on spinel substrates", Applied Physics Letters, vol. 69, Issue 16, Oct. 14, 1996, pp. 2418-2420.
King, et al., "40% efficient metamorphic GaInP/GaInAs/Ge multijunction solar cells", Applied Physics Letters, vol. 90, Issue 18, Apr. 30, 2007, pp. 183516-1-183516-3.
King, "Multifunction solar cells used in concentrator photovoltaics have enabled record-breakiong efficiencies in electricity generation from the Sun's energy, and have the potential to make solar electricity cost-effective at the utility scale", Nature Photonics, May 2008, vol. 2, pp. 284-286.
Kuo, "Bowing parameter of zincblende $In_xGa_{1-x}N$", Optics Communications, 2007, vol. 280, pp. 153-156.
Kuramata, et al., "Properties of GaN Epitaxial Layer Grown on (111) $MgAl_2O_4$ Substrate", Solid-State Electronics, vol. 41, Issue 2, Feb. 1997, pp. 251-254.
Li, et al., "Room temperature green light emission from nonpolar cubic InGaN/GaN multi-quantum-wells", Applied Physics Letters, vol. 90, Issue 7, Feb. 12, 2007, pp. 071903-1-071903-3.
Li, et al., "Room-Temperature Epitaxial Growth of GaN on Atomically Flat $MgAl_2O_4$ Substrates by Pulsed-Laser Depostition", Japanese Journal of Applied Physics, vol. 45, No. 17, May 2006, pp. L457-L459.
Li, et al., "Epitaxial growth of single-crystalline AlN films on tungsten substrates", Applied Physics Letters, vol. 89, Issue 24, Dec. 11, 2006, pp. 241905-1-241905-3.
Lieten, et al., "Suppression of domain formation in GaN layers grown on Ge (1 1 1)", Journal of Crystal Growth, vol. 311, Issue 5, Feb. 15, 2009, pp. 1306-1310.
Ludeke, "Morphological and chemical considerations for the epitaxy of metals on semiconductors", Journal of Vacuum Science & Technology. B, Microelectronics and nanometer structures : processing, measurement, and phenomena : an official journal of the American Vacuum Society, vol. 2, Issue 3, Jul.-Sep. 1984, pp. 400-406.
Massies, et al., "Epitaxial Relationships between Al, Ag AND GaAs{001} Surfaces", Surface Science, vol. 114, Issue. 1, Jan. 2, 1982, pp. 147-160.
Mikulics, et al, "Growth and properties of GaN and AlN layers on silver substrates", Applied Physics Letters, vol. 87, Issue 21, Nov. 2005, pp. 212109-1-212109-3 .
Mitamura, et al., "Growth of InN films on spinel substrates by puled laser deposition", physica status solidi (RRL)—Rapid Research Letters, Oct. 2007, vol. 1, Issue 5, Oct. 2007, pp. 212-213.
Nikishin, et al., "Gas source molecular beam epitaxy of GaN with hydrazine on spinel substrates", Applied Physics Letter, vol. 72, Issue 9, May 11, 1998, pp. 2361-2363.
Norman, et al., "Low cost III-PV on A1-foil substrates", FY09 AOP Proposal—Seed Fund Project, 2009, pp. 1-5.
Norton, et al., "Epitaxial $YBa_2Cu_3O_7$ on Biaxially Textured Nickel (001): An Approach to Superconducting Tapes with High Critical Current Density", Science, vol. 274, Nov. 1, 1996, pp. 755-757.
Pacheco-Salazar, et al., "Photoluminescence measurements on cubic InGaN layers deposited on a SiC substrate", Semiconductor Science and Technology, vol. 21, No. 7, Jul. 2006, pp. 846-851.
Palmstøm, "Epitaxy of Dissimilar Materials", Annual Review of Materials Science, vol. 25, Aug. 1995, pp. 389-415.
Pan, et al., "Increasing cube texture in high purity aluminium foils for capacitors", Materials Science and Technology, vol. 21, Issue 12, Dec. 2005, pp. 1432-1435.
Phillips, et al., "Research challenges to ultra-efficient inorganic solid-state lighting", Laser & Photonics Reviews, Dec. 2007, vol. 1, Issue 4, Dec. 2007, pp. 307-333.
Phillips, et al., "UK cracks GaN-on-silicon LEDs", Compound Semiconductor, vol. 15, No. 2, Mar. 2009, pp. 19-22.
Pilkington, et al., "The growth of epitaxial aluminium on As containing compound semiconductors", Journal of Crystal Growth, vol. 196, Issue 1, Jan. 1999, pp. 1-12.
Sacks, et al., "Growth and characterization of epitaxial $Fe_xAl_{1-x}$/(In,Al)As/InP and III-V/$Fe_xAl_{1-x}$/(In,Al)As/InP structures", Journal of Vacuum Science & Technology. B, Microelectronics and nanometer structures : processing, measurement, and phenomena : an official journal of the American Vacuum Society, May/Jun. 1999, vol. 17, No. 3, pp. 1289-1293.
Kuznetsov, et al., "General Orientational Characteristics of Heteroexpitaxial Layers of AII and BVI Semiconductors on Sapphire and Semiconductor Substrates with Diamond and Sphalerite Structures (AIIBV)," Crystallography Reports, vol. 47, No. 3, Nov. 3, 2002, pp. 514-518.
Sands, et al., "Epitaxial growth of GaAs/NiA/GaAs heterostructures," Applied Physics Letters, vol. 52, Issue 15, Apr. 11, 1988, pp. 1216-1218.
Sands, et al, "Expitaxial Metal (NiA1)-Semiconductor (III-V) Heterostructures by MBE," Surface Science, vol. 228, Issues 1-3, Apr. 1990, pp. 1-8.
Scarpulla, et al., "GdN (1 1 1) heteroepitaxy on GaN (0 0 0 1) by N2 plasma and NH3 molecular beam expitaxy," Journal of Crystal Growth, vol. 311, Issue 5, Feb. 1, 2009, pp. 1239-1244.
Sun, et al., "Mg-doped green light emitting diodes over cubic (111)$MgAl_2O_4$ substrates," Applied Physics Letters, vol. 70, Issue 11, Mar. 17, 1997, pp. 1444-1446.
Suzuki, et al., "MBE growth of GaN on MgO substrate," Journal of Crystal Growth, vols. 301-202, Apr. 2007, pp. 478-481.
Tadayon, et al., "Growth of GaAs-A1-GaAs by migration-enhanced epitaxy," Applied Physics Letters, vol. 53, Issue 26, Dec. 26, 1988, pp. 2664-2665.
Tinjod, et al, "Alumina-rich spinel A new substrate for the growth of high quality GaN-based light-emitting diodes," Journal of Crystal Growth, vol. 285, Issue 4, Dec. 15, 2005, pp. 450-458.

(56) References Cited

OTHER PUBLICATIONS

Tolle, et al., "Epitaxial growth of group III nitrides on silicon substrates via a reflective lattice-matched zirconium diboride buffer layer," Applied Physics Letters, vol. 82, Issue 15, Apr. 14, 2003, pp. 2398-2400.
Tsuchiya, et al., "Initial stages of InN thin film growth onto MgAl2O4(111) and α-Al2O3(0 0 • 1)substrates," Journal of Crystal Growth, vol. 220, Issue 3, Dec. 2000), pp. 191-196.
Vurgaftman, et al., "Band parameters for nitrogen-containing semiconductors," Journal of Applied Physics, vol. 94, Issue 6, Sep. 15, 2001, pp. 3675-3696.
Yang et al., "Microstructure evolution of GaN buffer layer on MgAl2O4 substrate," Journal of Crystal Growth, vol. 193, Issue 4, Oct. 15, 1998, pp. 478-483.
Yamada, et al., "Strong photoluminescene emission from polycrystalline GaN layers grown on W, Mo, Ta, and Nb metal substrates," Applied Physics Letters, vol. 78, Issue 19, May 7, 2001, pp. 2849-2851.
Yao, et al., "Fabrication of AlAs/Al/AlAs heterostructures by molecular beam epitaxy and migration enhanced eptaxity," Journal of Crystal Growth, vol. 111, Issues 1-4, May 2, 1991, pp. 221-227.
Wang, et al., "Lattice Parameters and Local Lattice Distortions in fcc-Ni-Solutions," Metallurgical and Materials Transactions A, vol. 38A, Mar. 2007, pp. 562-569.
Zhao, et al., "Transmission electron microscope study on electrodeposited Gd2O3 and Gd2Zr2O7 buffer layers for YBa2Cu3O7-δ superconductors," Physica C, vol. 478, Issue 14, Jul. 15, 2008, pp. 1092-1096.
Narayan, et al., "Domain epitaxy: A unified paradigm for thin film growth," Journal of Applied Physics vol. 93, No. 1, Jan. 1, 2003, pp. 278-285.
Goyal, et al., "Low Cost, Single Crystal-like Substrates for Practical, High Efficiency Solar Cells," AIP Conf. Proc. vol. 404, Sep. 1, 1997, pp. 377-394.
Ohta, et al., "Epitaxial growth of InN on nearly lattice-matched (Mn,Zn)Fe2O4," Solid State Communictions, vol. 137, Issue 4, Jan. 2006, pp. 208-211.
Trampert, "Heteroepitaxy of dissimilar materials; effect of interface structure on strain and defect formation," Physica E, vol. 12, Issues 2-4, Mar. 2002, pp. 1119-1125.
Yang, et al., "InGaNGaN based light emitting diodes over (111) spinel substrates," Applied Physics Letters, vol. 69, Issue 3, Jul. 15, 1996, pp. 369-370.
Zhou, "Metal-oxide interfaces at the nanoscale," Applied Physics Letters, vol. 94, Issue 23, Jun. 9, 2009, pp. 233115-1-233115-3.
Armitage, et al., "Lattice-matched HfN buffer layers for epitaxy of GaN on Si," Applied Physics Letters, vol. 81, Issue 8, Aug. 19, 2002, pp. 1450-1452.
Hooks, et al., "Epitaxy and Molecular Organization on Solid Substrates," Advanced Materials, vol. 13, Issue 4, Feb. 19, 2001, pp. 227-241.
Zheleva et al., "Epitaxy growth in large lattice mismatch systems," Journal of Applied Physics, vol. 75, Issue 2, Jan. 15, 1994, pp. 860-871.
Narayan, "New Frontiers in Thin Film Growth and Nanomaterials" Metallurgical and Materials Transactions B, vol. 36B, Issue 1, Feb. 2005, pp. 5-22.
Okamoto, et al., "Instabailities in the growth of AlxGa(1-x)AsAlyGa(1-y) structures by molecular beam epitaxy," Journal of Applied Physics, vol. 53, Issue 3, Mar. 1, 1982, pp. 1532-1535.
Schermer, et al., "High rate expitaxial lift-off of InGaP films for GaAs substrates," Applied Physics Letters, vol. 76, Issue 15, Apr. 15, 2000, pp. 2131-2133.
Yu, et al., "Diffuson reactions at Al—MgAl2O4 interfaces—and the effect of applied electric fields," Journal of Material Science, vol. 41, Issue 23, Dec. 23, 2006, pp. 7785-7797.
Schweinfest et al., "High-recision assessment of interface lattice offset by quantitative HRTEM," Journal of Microscopy, vol. 194, Issue 1, Apr. 1999, pp. 142.

Schweinfest et al., "Atomistic and electronic strucutre of Al/MgAl2O4 and Ag/MgAl2O4 interfaces," Philosophical Magazine, vol. 81, Issue 4, 2001, pp. 927-955.
Yamada "Ionized Cluster Beam Deposition and Epitaxy of Metal Films on Large Lattice Misfit Substrates," Physica Scripta, vol. T35, 1991, pp. 245-250.
Miura et al., "Single-crystal Al growth on Si(111) by low-temparature molecular beam epitaxy," Applied Physics Letters, vol. 62, Issue 15, Apr. 12, 1993, pp. 1751-1753.
Fortuin et al., "Characterization of single-crystalline Al films grown on Si(111)," Surface Science, vol. 366, Issue 2, Oct. 20, 1996, pp. 285-294.
Yamada et al., "Large-misfit heteroepitaxy of aluminum films by ICB deposition," Nuclear Instruments and Methods in Physics Research Section B, vol. 59-60, Jul. 1991, pp. 302-307.
Ueno et al., "Epitaxial Al Schottky contacts formed on (111) GaAs," Applied Physics Letters, vol. 56, vol. 21, Issue 22, May 28, 1990, pp. 2204-2206.
Thangaraj et al., "Expitaxial growth of (011) Al on (100) Si by vapor deposition," Applied Physics Letters, vol. 61, Issue 1, Jul. 6, 1992, pp. 37-39.
Thangaraj et al., "Expitaxial growth of (001) Al on (111) Si by vapor deposition," Applied Physics Letters, vol. 61, Issue 8, Aug. 24, 1992, pp. 913-915.
Sosnowski et al., "Importance of steps in heteroepitaxy: The case of aluminum on silicon," Applied Physics Letters, vol. 65, Issue 23, Dec. 5, 1994, pp. 2943-2945.
Buschel et al., "RHEED Studies of MBE-grown Aluminum Layers on {111}-Oriented Silicon Substrates," Crystal Research and Technology, vol. 26, Issue 2, 1991, pp. 211-215.
Tempel et al., "The Epitaxial Orientation of Al on Si," Crystal Research and Technology, vol. 28, Issue 3, 1993, pp. 317-324.
Zur et al., "Lattice match: An application to heteroepitaxy," Journal of Applied Physics, vol. 55, Issue 2, Jan. 15, 1984, pp. 378-386.
PCT/US10/58535 International Preliminary Report on Patentability dated Jun. 4, 2013.
PCT/US10/58535 Written Opinion dated Mar. 3, 2011.
PCT/US10/58514 International Search Report and Written Opinion dated Apr. 6, 2011.
Nakajima et al., "Growth of Single-Crystal Aluminum Films on Silicon Substrates by Dc Magnetron Sputtering," Japanese Journal of Applied Physics, vol. 31, Part 1, No. 6A, Jun. 15, 1992, pp. 1860-1867.
Yokoyama et al., "Single-Crystal Growth of Al(110) on Vicinal Si(100) in Ultra-High-Vacuum Sputtering System," Japanese Journal of Applied Physics, vol. 30, Part 1, No. 12B, Dec. 30, 1991, pp. 3685-3690.
Bartholomeusz et al., "Modeling Structural and Chemical Relaxation at the Al/Si Epitaxial Interface", Journal of Electronic Materials, Jul. 1991, vol. 20, No. 10, pp. 759-765.
Kaneko et al., "Cubic-on-cubic growth of a MgO (001) thin film prepared on Si(001) substrate at low ambient pressure by the sputtering method", EPL, 2008, vol. 81, pp. 46001-p1-46001-p5.
Kato et al., "Epitaxial growth of sputtered Al films on Si(001) substrates", Philosophical Magazine Part B, Sep. 1991 vol. 64, Issue 3, pp. 317-326.
LeGoues et al., "Atomic structure of the epitaxial Al—Si interface", Philosophical Magazine A, 1986, vol. 53, Issue 6, pp. 833-841.
Lu et al., "Direct observation of an incommensurate solid-solid interface", Physical Review B, May 1, 1989, vol. 39, No. 13, pp. 9584-9586.
Niwa et al., "Epitaxial Growth of Al on Si(001) by Sputtering", Applied Physics Letters, Jul. 1991, vol. 59, No. 5, pp. 543-545.
Niwa et al., "Single-crystal Al films grown by sputtering on (111)Si substrates", Applied Physics Letters, May 18, 1992, vol. 60, pp. 2520-2521.
Rawdanowicz, "Laser Molecular Beam Epitaxial Growth and Properties of III-Nitride Thin Film Heterostructures on Silicon", Dissertation, 2005, Materials Science and Engineering, NC State University, pp. 1-189.
Trampert et al., "Heteroepitaxy of Large-Misfit Systems: Role of Coincidence Lattice", Crystal Research and Technology, 2000, vol. 35, Nos. 6-7, pp. 793-806.

(56) References Cited

OTHER PUBLICATIONS

Westmacott et al., "Physical vapour deposition growth and transmission electron microscopy characterization of epitaxial thin metal films on single-crystal Si and Ge substrates", Philosophical Magazine A, 2001, vol. 81, No. 6, pp. 1547-1578.

Wu et al., "Universal Bandgap Bowing in Group-III Nitride Alloys", Solid State Communications, 2003, vol. 127, pp. 411-414.

Yokota et al., "Cross-sectional TEM observation of the epitaxial Al/Si(111) interface", Applied Surface Science, 1992, vols. 60-61, pp. 385-390.

* cited by examiner

COINCIDENT SITE LATTICE-MATCHED GROWTH OF SEMICONDUCTORS ON SUBSTRATES USING COMPLIANT BUFFER LAYERS

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

CROSS REFERENCE TO RELATED APPLICATION

This patent application is related to PCT/US2010/058514 "Methods of Producing Free-Standing Semiconductors using Sacrificial Buffer Layers and Recyclable Substrates", filed on the same day as the present application, which is hereby incorporated by reference as though fully set forth herein.

BACKGROUND

High-performance semiconductor devices often incorporate one or more layers of substantially crystalline semiconductor materials. Highly efficient III-V multi-junction photovoltaic solar cells incorporate III-V crystalline semiconductor materials such as GaInAs and GaInAlP alloy that are produced using epitaxy on single crystal Ge or GaAs substrates. High efficiency light emitting diodes (LEDs) and diode lasers may be fabricated from epitaxially grown nitride semiconductors such as InGaN. High electron mobility transistors may incorporate epitaxially grown arsenide or antimonide semiconductor materials such as InAs and InSb.

The semiconductor materials used in these high-performance semiconductor devices are typically selected based on optoelectronic performance criteria such as the specific band gap or electron mobility of the material. The function of these semiconductor devices is essentially governed by the optoelectronic properties and arrangement of the device's semiconductor materials. Further, the quality of the crystalline semiconductor materials of these devices impact their overall performance; defects, impurities and other flaws in the crystalline structure of the semiconductor materials may degrade the performance of the semiconductor devices.

Typically, high-performance semiconductor devices are fabricated using an epitaxial growth process in which a monocrystalline semiconductor material is deposited on a monocrystalline substrate material. However, the ability to produce low defect density crystals of the semiconductor materials used in high-performance semiconductor devices is constrained by several factors. Typically, the crystal lattice dimensions of the substrate must be closely matched to the corresponding lattice of the epitaxially deposited semiconductor material in order to avoid lattice mismatching that may introduce internal stresses and resultant undesired defects in the semiconductor material. Further, if the thermal expansion properties of the substrate material are significantly different from the corresponding thermal expansion properties of the semiconductor material, the temperature range experienced by the device during typical epitaxial growth processes may induce differential swelling and shrinking of the substrate material relative to the deposited semiconductor material, resulting in cracking and other undesired defects.

Existing semiconductor fabrication methods use a number of approaches to avoid the development of defects in the crystalline semiconductor materials. In many methods, the substrate material may be lattice-matched to the deposited semiconductor material. For example, III-V multi-junction photovoltaic cells may be grown on a Ge or GaAs substrate that is lattice-matched to the deposited III-V alloy semiconductor materials of the device. However, many of the substrate materials that are lattice-matched to desirable III-V semiconductor materials may be difficult to obtain in single-crystal form of suitable quality, may be relatively rare or prohibitively expensive, or may be difficult to obtain or produce in large quantities or suitable sizes. In the case of some III-V semiconductors, such as the InGaN alloys used in high-performance LEDs, a suitable lattice-matched substrate may not exist.

To reduce the stresses introduced by a lattice mismatch between the substrate and the deposited semiconductor material, some existing fabrication methods make use of a series of graded buffer layers, in which the lattice of the buffer layer closest to the substrate is slightly mismatched with the lattice of substrate, and the uppermost buffer layer is only slightly mismatched with the semiconductor material to be deposited. The intermediate buffer layers are designed to gradually transition from the buffer lattice dimensions to the semiconductor lattice dimensions, and the number of buffer layers used depends in part upon the degree of lattice mismatch between the substrate and the semiconductor. However, stresses may still occur between successive buffer layers that may result in defects that may impact device performance. In addition, the introduction of graded buffer layers between the substrate and the deposited semiconductor may result in added process complexity and expense, and the introduction of impurities that may also impact device performance.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

Aspects of the present disclosure provide a method of producing a semiconductor device. The method includes providing a substrate that may include a crystalline surface and growing a crystalline buffer material on the crystalline surface by coincident site lattice-matched epitaxy to form a compliant buffer layer. The method further includes growing a first crystalline semiconductor material on the compliant buffer layer by coincident site lattice-matched epitaxy to form a device layer.

Other aspects further provide a semiconductor device that includes a substrate that includes a crystalline surface, a compliant buffer layer that includes a crystalline buffer material, an upper buffer surface, and a lower buffer surface. In this aspect the lower buffer surface is coincident site lattice-matched to the crystalline surface. The semiconductor device also includes a device layer that includes a first crystalline semiconductor material, a first device layer upper surface, and a first device layer lower surface. The first device layer lower surface is coincident site lattice-matched to the upper buffer surface.

In one particular arrangement, a semiconductor device is provided that includes a Si substrate and a compliant buffer layer that includes crystalline Al, in which the compliant buffer layer is coincident site lattice-matched to the silicon substrate. The device further includes a device layer that includes a first crystalline semiconductor material chosen from III-V semiconductor materials, III-V semiconductor alloys, II-VI semiconductor materials, II-VI semiconductor alloys, Ge, SiGe, or group IV semiconductor alloys, in which the first device layer is coincident site lattice-matched to the compliant buffer layer.

The method of producing a semiconductor device provided herein overcomes many of the limitations of previous fabrication methods. The use of coincident lattice-matching epitaxy makes possible the deposition of a wider variety of materials, including compliant buffer layer materials such as aluminum, on relatively inexpensive and/or commonly available materials such as silicon with a relatively low density of defects. Further, the inclusion of a compliant buffer layer that includes a ductile material, such as Al, provides a surface upon which a wide variety of semiconductor materials may be deposited using coincident site lattice-matching epitaxy to produce one or more device layers with relatively low defect densities. In addition, the ductile material of the compliant buffer layer may absorb internal stresses due to slight lattice mismatching and/or thermal stresses during fabrication. The semiconductor devices produced using this method, including but not limited to LEDs, photovoltaic (PV) solar cells, and transistors possess enhanced performance as a result of the relatively low defect densities in the semiconductor materials included in the devices.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting.

FIG. 2A illustrates an interface produced using conventional, non-coincident site, lattice-matched epitaxial growth. FIG. 2B illustrates an interface produced using coincident site lattice-matched epitaxial growth with a 45° rotation of the semiconductor lattice.

Corresponding reference characters and labels indicate corresponding elements among the view of the drawings. The headings used in the figures should not be interpreted to limit the scope of the claims.

DETAILED DESCRIPTION

Figure 1A:
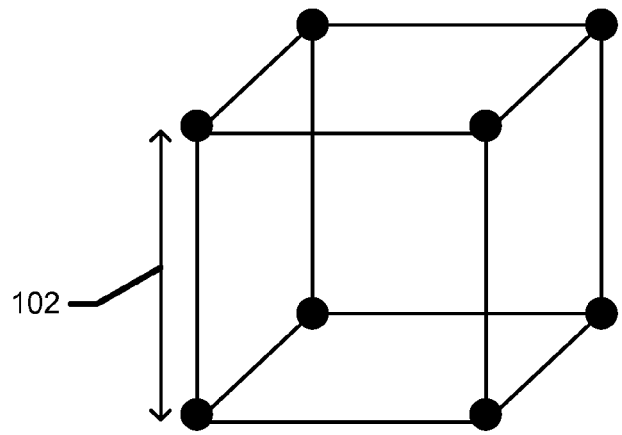
FIG. 1A is a schematic diagram of a simple cubic crystal lattice.

A need exists for a method of producing low defect density crystalline semiconductor materials using epitaxial deposition on relatively inexpensive and widely available substrates without need for complex process methods such as multiple graded buffer layers. This production method may be used for the fabrication of high-performance semiconductor devices such as high efficiency photovoltaic cells, high performance LEDs, and high electron mobility transistors.

A method of producing a semiconductor device is provided that overcomes many of the limitations of previous production methods. The method includes providing a substrate and forming a single compliant buffer layer by growing a crystalline buffer material such as aluminum onto the crystalline surface by coincident site lattice-matched epitaxy. This single crystal of buffer material resulting from this process may have a relatively low defect density due to the close lattice matching afforded by the coincident site lattice-matching epitaxy process. The buffer material may further possess desirable properties including malleability for absorbing internal stresses. Depending on the semiconductor device produced using this method, the buffer material may further possess other characteristics such as light reflectivity and electrical conductivity.

The method further includes forming a device layer by growing a first crystalline semiconductor material on the compliant buffer layer using a coincident site lattice-matched epitaxial process. At least one additional crystalline semiconductor material may be grown on the first crystalline semiconductor material using lattice-matching epitaxy.

This method of producing a semiconductor device overcomes many previous limitations of existing semiconductor methods. The substrate may be composed of a relatively inexpensive and structurally tough substrate material. Further, the lattice structure of a suitable substrate material, such as silicon, is compatible with coincident site lattice-matched epitaxial deposition of a variety of buffer materials, resulting in a compliant buffer layer with a relatively low density of lattice defects. The buffer material may be compatible with coincident site lattice-matched epitaxial deposition of a variety of semiconductor materials, and the material may further be malleable and capable of absorbing internal stresses during the fabrication process.

A semiconductor device produced using the method described above is further provided. Non-limiting examples of semiconductor devices that may be produced using this method include photovoltaic solar cells, light emitting diodes (LEDs), lasers, high electron mobility transistors (HEMTs), and light detectors.

Aspects of the method of producing a semiconductor device and exemplary semiconductor devices using this method are described in detail below.

I. Methods of Producing Semiconductor Devices

A method of producing a semiconductor device is provided that includes forming a compliant buffer layer and at least one layer of crystalline semiconductor on a substrate. The compliant buffer layer and the first semiconductor layer are produced using coincident site lattice-matched epitaxy, resulting in the production of crystalline layers that have a relatively low density of defects that may degrade the performance of the semiconductor device.

a. Coincident Site Lattice-matched Epitaxy

Epitaxy, as defined herein, relates to a process in which one crystalline material is grown or deposited on another crystalline substrate in an ordered manner. Depending on the particular lattice structures of the deposited material and the substrate, the epitaxial process may result in varying degrees of lattice matching at the interface between the deposited material and the substrate. Mismatched lattices typically introduce internal stresses to the deposited crystalline material that may induce defects within the crystalline material that may degrade the performance of a device containing this material.

Figure 1B:
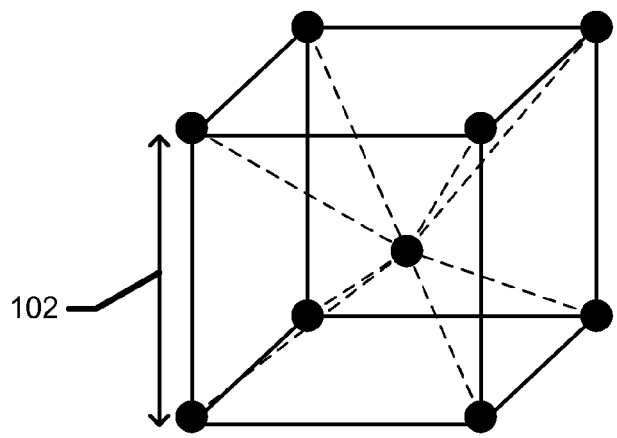
FIG. 1B is a schematic diagram of a body-centered cubic crystal lattice.
Figure 1C:
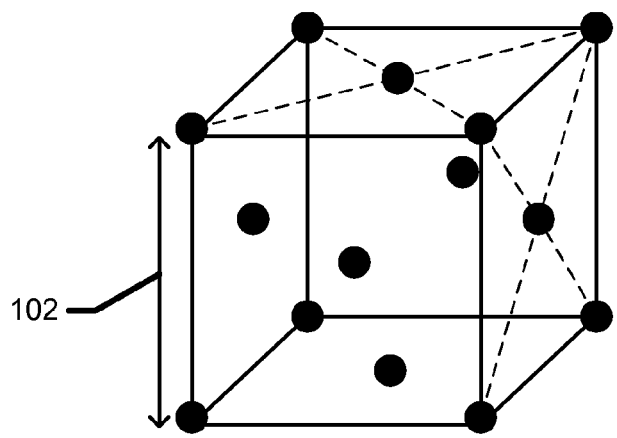
FIG. 1C is a schematic diagram of a face-centered cubic (fcc) crystal lattice.

The lattice structure of a crystalline material may be specified by a lattice parameter (a), defined herein as the length between unit cells in a crystal lattice. For example, three space lattice types of the cubic crystal system are illustrated in FIG. 1: a simple cubic structure 100 (FIG. 1A), a body-centered cubic structure 100A (FIG. 1B), and a face-centered cubic structure 100C (FIG. 1C). In each of the three structures in FIG. 1A-FIG. 1C, the lattice parameter (a) 102 corresponds to the length of any face of the cubic unit cell.

During the process of lattice-matched epitaxy, the crystal lattices of the deposited material are layered directly on top of the substrate lattices. For example, a material having a simple cubic structure shown in FIG. 1A may be layered on top of substrate material having the same simple cubic structure. So long as the deposited material and the substrate material have similar lattice constants, each atom in the deposited material's lattice will be aligned with a corresponding atom in lattice at the surface of the substrate, resulting in minimal internal stresses and defects at the interface of the substrate and the deposited material.

For a given substrate with a known lattice structure, the materials that may be deposited directly on the substrate using conventional lattice-matched epitaxy are limited to those materials having lattice constants that are within about 2% or less of the substrate's lattice constant. However, materials with lattice constants that are significantly mismatched with the lattice constant of the substrate may be deposited using coincident site lattice-matched epitaxy, as shown in FIG. 2. Coincident site lattice-matched epitaxy, as defined herein, is an epitaxy process in which a material having a lattice constant that is different from the lattice constant of the substrate is deposited with a high degree of lattice match by virtue of a scaled or rotated lattice match. It is to be noted that lattice-matching epitaxy may be defined as a special case of coincident site lattice-matching epitaxy in which a 1:1 ratio of the lattice constants of the substrate and deposited material results in a scaled lattice-match.

Figure 2A:
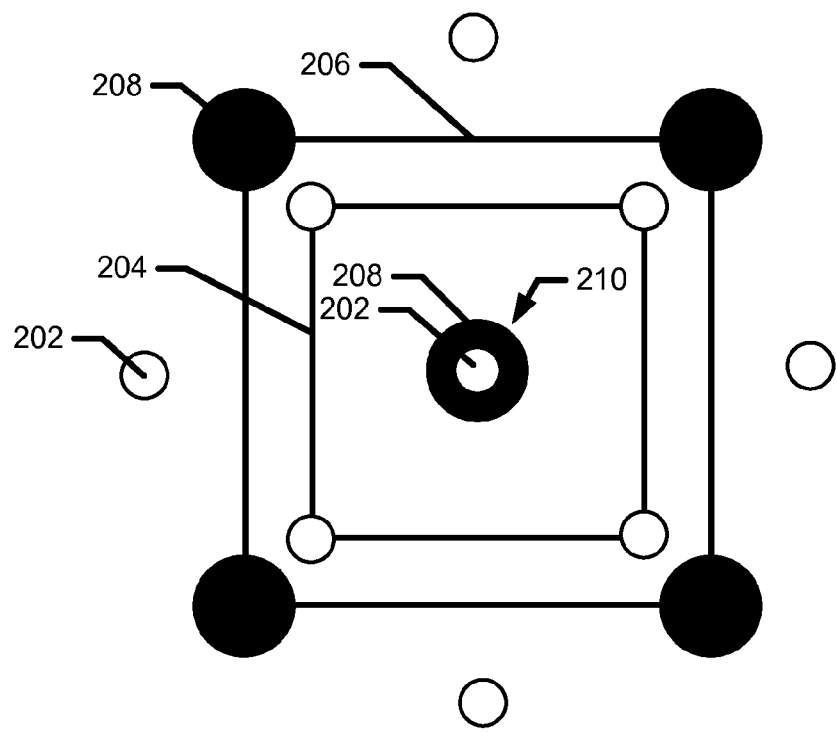
FIG. 2A and FIG. 2B are schematic diagrams illustrating the interface of the unit cells of an fcc lattice-based crystalline semiconductor material epitaxially grown on an fcc lattice crystalline substrate material.
Figure 2B:
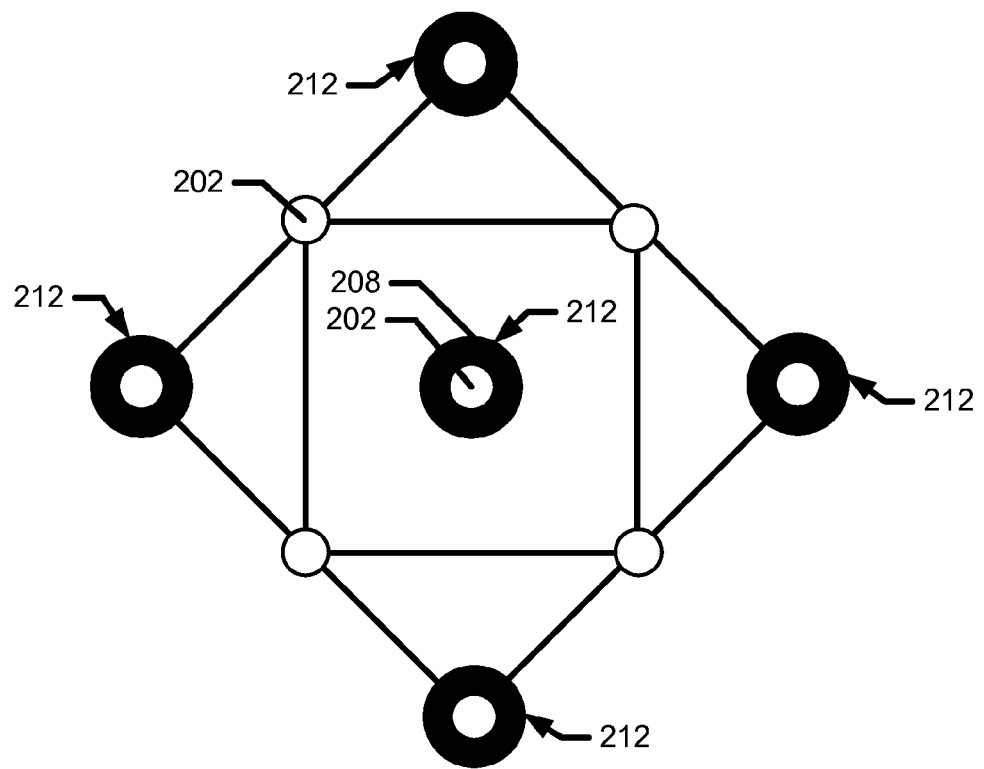

FIG. 2 illustrates an example of the coincident site lattice matching of a substrate 202 having a lattice constant 204 that is different than the lattice constant 206 of the deposited material 208 by virtue of a rotated lattice match. FIG. 2A illustrates the interface of the substrate 202 and the deposited material 208 using lattice-matching epitaxy. The lattice-matched epitaxy results in significant lattice mismatching, because the lattices of the substrate and the deposited material are matched at only a single point 210. FIG. 2B illustrates an example of the same material 208 deposited on the same substrate 202 using coincident site lattice-matched epitaxy. In this example, the two materials exhibit a significant degree of lattice matching when the lattice of the deposited material is rotated by 45° relative to the substrate lattice. Because the ratio of the deposited material's lattice constant 206 to the substrate's lattice constant 204 is equal to the square root of 2, a high degree of matching is possible with the 45° lattice rotation.

For the (001) orientation shown, the lattice of the deposited material may be rotated by any angle ranging from 0° to about 45°, depending on the ratio of the lattice constant of the substrate to the lattice constant of the deposited material. The rotation angle of the deposited material's lattice relative to the substrate lattice may be selected to minimize the lattice mismatch between the deposited material and the substrate. Typically, a coincident site lattice mismatch below about 0.5% may result in a deposited layer with a relatively low density of defects caused by lattice mismatching.

Further, different crystal planes of the substrate may be used as the crystalline surface for deposition of material by coincident site lattice-matched epitaxy. For example, if the substrate has a face-centered cubic lattice structure, different crystal planes of the substrate, including but not limited to the (001), (110) or (111) crystal planes may be used as the substrate surface. The spacing between adjacent atoms in a particular crystal plane of the substrate may result in a better degree of lattice matching with the lattice of the deposited material.

Figure 3:
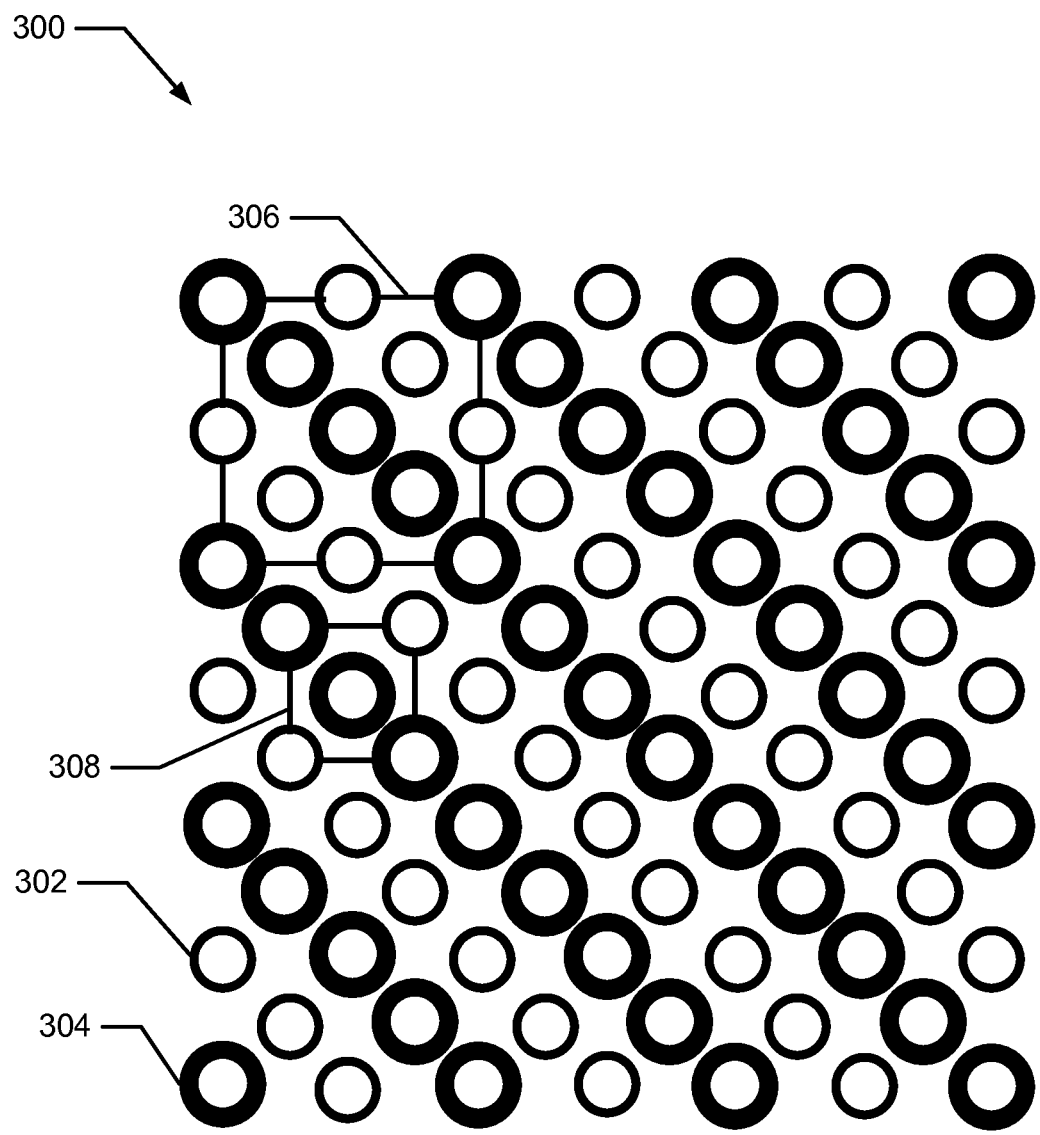
FIG. 3 is a schematic illustration of coincident site lattice-matching at the (001) interface between the Al atoms of an fcc lattice-based $MgAl_2O_4$ spinel substrate and a fcc Al buffer layer in which the lattice constant of the buffer layer is ½ of the lattice constant of the substrate.

FIG. 3 illustrates an example of the coincident site lattice matching of a $MgAl_2O_4$ spinel substrate 304 having a lattice constant 306 that is about twice the lattice constant 308 of the deposited Al material 302 by virtue of a scaled lattice match. In this example, because every other Al atom 302 in the deposited material lattice is matched to a substrate Al atom 304, the material may be deposited on the substrate with relatively low levels of internal stress, resulting in a crystalline deposit with a relatively low defect density.

Coincident site lattice-matching epitaxy may be used to deposit crystalline materials having any known crystal lattice structure onto a substrate having any known crystal lattice structure. Non-limiting examples of suitable crystal lattice structures suitable for coincident site lattice-matching epitaxy include simple cubic, body-centered cubic, face-centered cubic, rock salt, zincblende, diamond cubic, wurtzite, and hexagonal close-packed structures. In general, the crystal lattice structure of the substrate need not be the same structure as the crystal lattice structure of the deposited material.

Figure 4A:
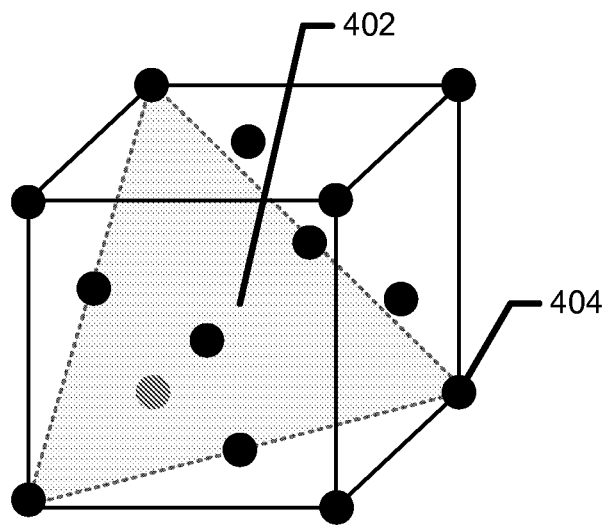
FIG. 4A is a schematic diagram of a (111) crystal plane in a face-centered cubic crystal lattice structure.
Figure 4B:
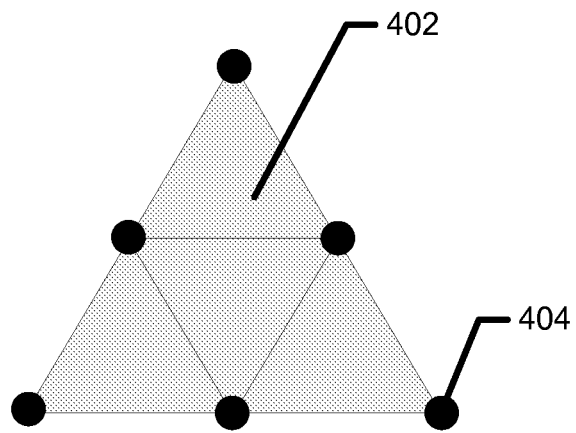
FIG. 4B is a schematic diagram showing the arrangement of atoms within the (111) crystal plane shown in FIG. 4A.

In order to better match the lattices of the materials during coincident site lattice-matching epitaxy, different planes of the substrate crystal may be used as the crystalline surface for the epitaxial deposition of another material. For example, the (111) plane of a face-centered cubic lattice based material, such as silicon with the diamond cubic structure, illustrated in FIG. 4A and FIG. 4B may be used in order to better match the lattice spacing of the deposited material. FIG. 4A illustrates the (111) plane shown in the face-centered cubic lattice, and FIG. 4B illustrates the arrangement of the lattice atoms as viewed within the (111) plane.

Figure 5A:
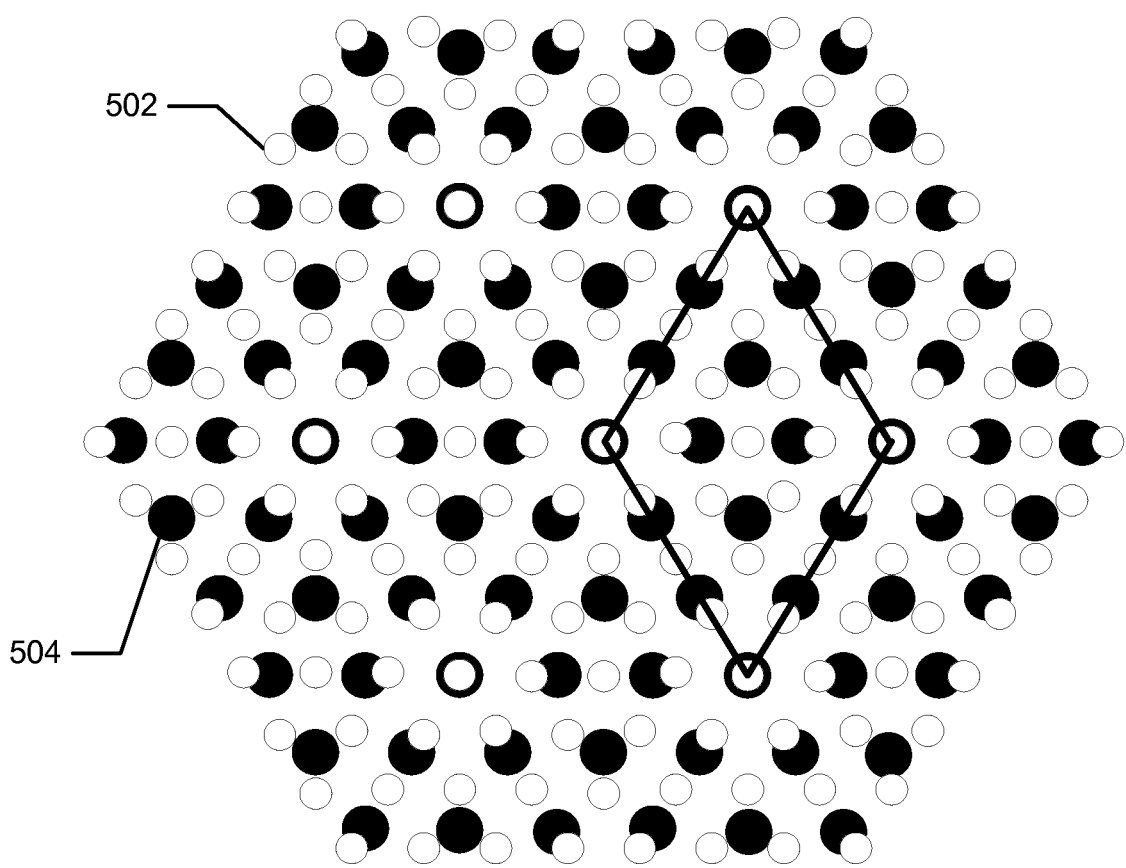
FIG. 5A is a schematic diagram illustrating the interface of the unit cells of crystalline aluminum epitaxially grown on the (111) crystal plane of single-crystal silicon.
Figure 5B:
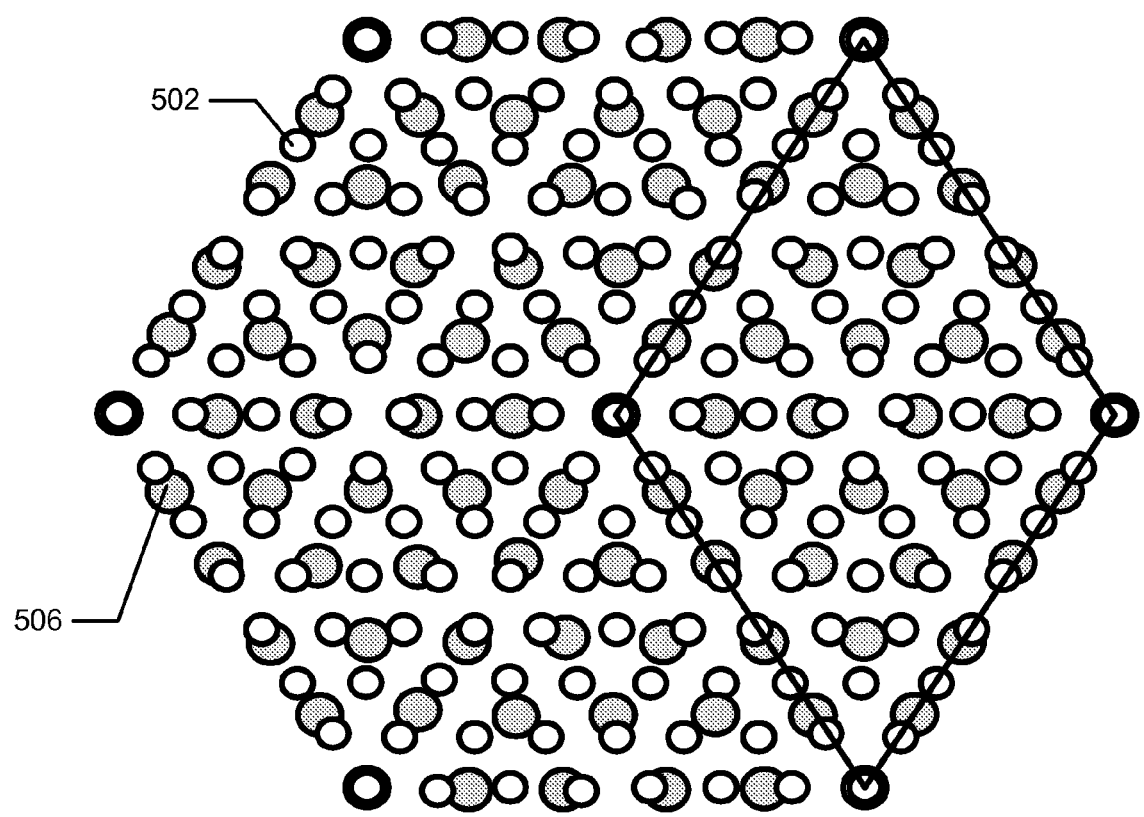
FIG. 5B is a schematic diagram illustrating the interface of the unit cells of crystalline aluminum epitaxially grown on the (111) crystal plane of single-crystal germanium.

For example, aluminum, which has a face-centered cubic structure, may be deposited on the (111) plane of silicon, as shown in FIG. 5A. Because the ratio of the lattice parameters of aluminum ($a_{Al}$) and silicon ($a_{Si}$) has an $a_{Al}/a_{Si}$ of ¾ with a lattice misfit of about only 0.5%, aluminum 502 may be grown on (111) silicon 504 as a single crystal with a low density of defects. Similarly, aluminum 502 may be grown as a single crystal on the (111) plane of germanium 506 as shown in FIG. 5B because the lattice parameter ratio $a_{Al}/a_{Ge}$ is about 5/7 with a lattice mismatch of only 0.2%. In general, a crystalline material may be grown on a crystalline substrate using coincident site lattice-matching epitaxy when the lattice mismatch is less than about 1% and the numbers in the lattice parameter ratio of the deposited material ($a_{deposit}$) and the substrate ($a_{substrate}$) do not exceed about 10.

b. Crystalline Substrate

A substrate that includes a crystalline surface is provided in an aspect of the method. Non-limiting examples of materials suitable for use as substrates include silicon, germanium, and gallium arsenide. As described above, any crystal plane of the substrate material may be used as the crystalline surface. Non-limiting examples of crystal planes that may be used as the crystalline surface include (100); (110); and (111) planes. Other crystal planes, such as the planes defined for a hexagonal crystal lattice structure may also be used as the crystalline surface.

In one particular example, silicon is provided for the deposition of the compliant buffer layer. Silicon is widely available in a variety of sizes in single crystal form and is coincident site lattice-matched closely with desired compliant buffer materials such as aluminum, as discussed herein. Further, silicon may be used as a functional component of some semiconductor devices produced using the method described herein. In addition, silicon is a common substrate for many other electrical components and thus silicon may be compatible with a wide variety of other semiconductor and other electrical components in electrical systems that may include a semiconductor device produced using the method described herein.

c. Growth of Compliant Buffer Layer

A compliant buffer layer may be grown on the crystalline surface in an aspect of the method. The compliant buffer layer may be grown or otherwise provided using any suitable method of epitaxy including but not limited to vapor-phase epitaxy (VPE), liquid-phase epitaxy (LPE), molecular beam epitaxy (MBE), and metal organic chemical vapor deposition (MOCVD). As used herein, the terms "growth" and "deposition" are synonymous terms referring to the epitaxial formation of a crystalline material on a surface of a substrate material.

The compliant buffer layer is composed of a crystalline material that possesses one or more of several material properties. The lattice constant of the compliant buffer layer may be selected to be compatible with the lattice constant of the substrate material for either lattice-matching epitaxy or coincident site lattice-matching epitaxy. Further, the lattice constant of the compliant buffer layer may be selected to be lattice-matched with the lattice of the III-V semiconductors that are deposited onto the compliant buffer layer using either lattice-matching epitaxy or coincident site lattice-matching epitaxy. The material of the compliant buffer layer may further be a malleable metal or metallic alloy material including but not limited to aluminum, in order to elastically or otherwise absorb any internal stresses created within the deposited III-V semiconductor material during the deposition process.

Non-limiting examples of suitable materials for the compliant buffer layer include fcc metals such as Al, Ag, Au, Pd, Pt and their alloys. In one particular example, the compliant buffer layer is composed of crystalline Al.

While various materials may be sufficient for the buffer, aluminum is a particularly desirable compliant buffer material due to a number of material properties. Aluminum is an electrically conductive material and may be used as an active electrical component in the semiconductor device produced using the method described herein. If the aluminum buffer layer is grown to a sufficient thickness, the buffer layer may also act as an integral reflective element to reflect light passing within semiconductor devices such as light-emitting diodes and photovoltaic cells. For example, light passing through active photovoltaic levels may be reflected off of the buffer longer and repass through the active layers effectively increasing the likelihood of photon absorption. Further, because Al is a group III element, III-V semiconductor materials deposited on an Al buffer layer may be less prone to contamination. In addition, the lattice constant of aluminum is well matched with a variety of semiconductor materials that are typically used in the construction of semiconductor devices, as summarized by way of illustration in Table 1 below:

TABLE 1

Example Semiconductors Lattice-matched to Aluminum Buffer Layer

| Deposited Semiconductor | Lattice Constant Ratio of Aluminum and Semiconductor ($a_{Al}/a_{SC}$) | Applications |
|---|---|---|
| GaAs | 5/7 | Solar cells, light emitters and detectors, transistors |
| InSb | 5/8 | High speed transistors, narrow band gap detectors and emitters |
| InAs | 2/3 | High speed transistors, narrow band gap detectors and emitters |
| GaSb | 2/3 | Light emitters and detectors |
| GaP | 3/4 | Solar cells, light emitters and detectors |
| GaN (wurtzite) | 9($\sqrt{2}$)/10 | High band gap emitters and detectors, high power transistors |
| InGaN (wurtzite, ~42% In) | 6($\sqrt{2}$)/7 | High band gap emitters and detectors, high power transistors |
| InGaN (wurtzite, ~23% In) | 7($\sqrt{2}$)/8 | High band gap emitters and detectors, high power transistors |

The compliant buffer layer may be grown on the crystalline surface by any suitable technique of epitaxial growth. Non-limiting examples of techniques suitable for epitaxial growth include vapor-phase epitaxy (VPE), liquid-phase epitaxy (LPE), molecular beam epitaxy (MBE), and metal organic chemical vapor deposition (MOCVD). Depending on the particular technique used for epitaxial growth, the deposition of the compliant buffer layer may take place at a deposition temperature ranging from about room temperature to about 700° C. or higher. In one particular aspect, the technique of deposition of the compliant buffer layer is molecular beam epitaxy.

The materials formed during the production of the device may be exposed to a wide range of temperatures during deposition and cooling. During the process, differential thermal expansion and contraction of the substrate and deposited semiconductor material may introduce defect-causing internal thermal stresses to the materials if no compliant buffer layer is present. In an aspect, the compliant buffer layer may accommodate the thermal expansion mismatch stresses between the semiconductor layers and substrate by relaxing its crystal structure, thereby allowing crack-free and low defect density semiconductor materials to be epitaxially deposited on substrates possessing a wide range of thermal expansion coefficients.

d. Growth of Semiconductor Materials

A crystalline semiconductor material may be grown on the compliant buffer layer to form a device layer in an aspect of the method. The semiconductor material may be deposited using any of the epitaxy techniques described herein. In one specific example, the semiconductor material is deposited using molecular beam epitaxy.

Depending on the material of the compliant buffer layer, the semiconductor material may be lattice-matched or coincident site lattice-matched to the buffer layer. For example, if a ductile crystalline metal, such as Al, is used for the compliant buffer layer, a device layer composed of a III-V semiconductor may be coincident site lattice-matched using a 45° lattice rotation as described above in FIG. 2B, or other rotation as described herein.

The crystalline semiconductor material of the device layer may be selected based on the desired optoelectronic properties, including but not limited to band gap and electron mobility. The crystalline semiconductor material may be chosen from materials including but not limited to III-V semiconductor materials, III-V semiconductor alloys, II-VI semiconductor materials, II-VI semiconductor alloys, and group IV semiconductor alloys. Non-limiting examples of III-V semiconductor materials include AlSb, AlAs, AlN, AlP, BN, BP, BAs, $B_{12}As_2$, GaSb, GaAs, GaN, GaP, InSb, InAs, InN, and InP. Non-limiting examples of III-V semiconductor alloys include AlGaAs, InGaAs, InGaP, AlInAs, AlInSb, GaAsN, GaAsP, GaAsSb, AlGaN, AlGaP, InGaN, InAsSb, InGaSb, AlGaInP, AlGaAsP, InGaAsP, InGaAsSb, InPAsSb, AlInAsP, AlGaAsN, InGaAsN, InAlAsN, GaAsSbN, GaInNAsSb, and GaInAsSbP. Non-limiting examples of II-VI semiconductor materials include CdSe, CdS, CdTe, ZnO, ZnSe, ZnS, and ZnTe. Non-limiting examples of II-VI semiconductor alloys include CdZnTe, HgCdTe, HgZnTe, and HgZnSe. As used herein, a III-V semiconductor material refers to a crystalline semiconductor material that includes one element from the Group III elements (B, Al, Ga, In, and Tl) and one element from the Group V elements (N, P, As, Sb, and Bi); a III-V semiconductor alloy refers to a crystalline semiconductor material that includes three or more elements from the Group III elements and the Group V elements, including at least one element from each of the two groups. As used herein, a II-VI semiconductor material refers to a crystalline semiconductor material that includes one Group II element (Zn, Cd, and Hg) and one Group VI element (O, S, Se, Te, and Po); a II-VI semiconductor alloy refers to a crystalline semiconductor material containing three or more elements from the Group II and Group VI elements, including at least one element from each of the two groups. As used herein, a group IV semiconductor alloy refers to a crystalline semiconductor material that includes two or more Group IV elements (C, Si, Ge, Sn, and Pb).

One or more additional crystalline semiconductor material layers may be deposited, grown, or otherwise provided on the first semiconductor material of the device layer to produce various possible devices. The additional crystalline semiconductor layer material may be chosen from any of the semiconductor materials described above, including but not limited to III-V semiconductor materials, III-V semiconductor alloys, II-VI semiconductor materials, and II-VI semiconductor alloys. The additional crystalline semiconductor material, is typically conventionally lattice-matched to the first crystalline semiconductor material of the device layer, but the additional crystalline semiconductor material may be coincident site lattice-matched, depending upon the particular choice of semiconductor materials.

The arrangement and number of semiconductor materials in the device layer may be determined based on the function of the particular device that is fabricated using this method. Specific examples of the arrangement of semiconductor materials in several devices are provided below.

II. Semiconductor Devices

Figure 6:
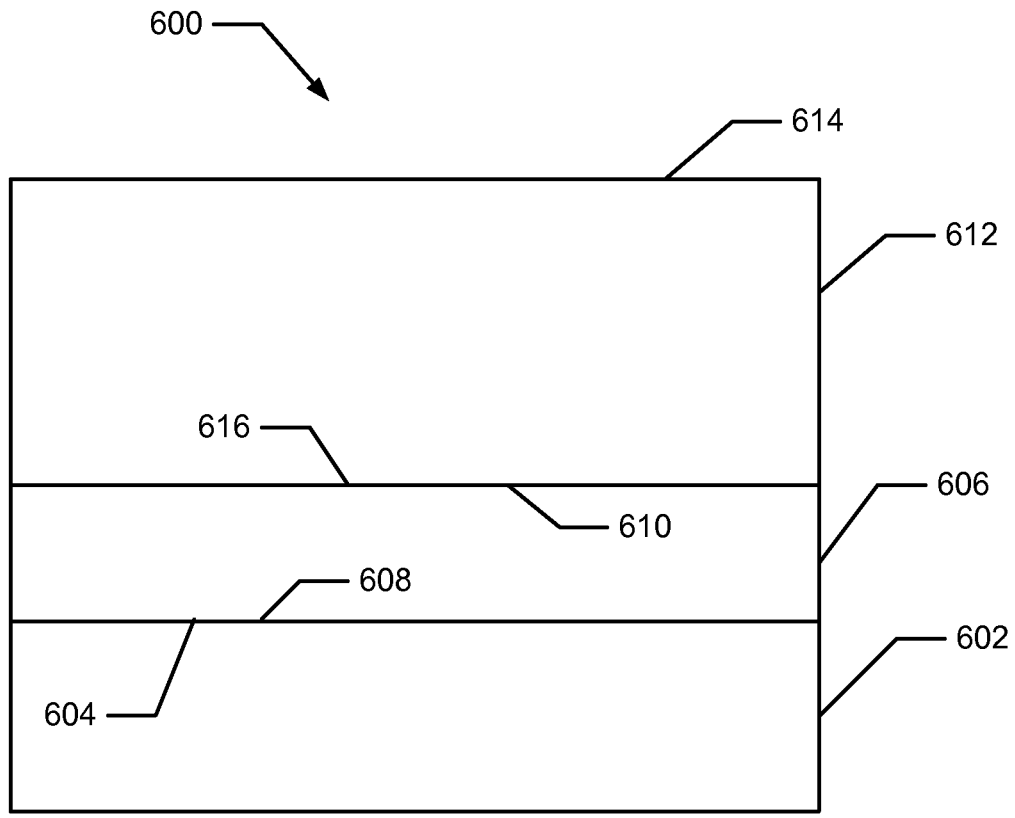
FIG. 6 is a schematic diagram of the layers of a semiconductor grown on a substrate using a compliant buffer layer.

FIG. 6 is a schematic diagram illustrating the general arrangement of materials in a semiconductor device 600 produced using the method described herein. The device 600 includes a substrate 602 that includes a crystalline surface 604 as described herein. For example, the crystalline surface 604 may be the (111) crystal plane of single-crystal silicon. The device 600 further includes a compliant buffer layer 606 made of a crystalline buffer material, such as single-crystal aluminum, also described herein. The compliant buffer layer 606 also includes an upper buffer surface 610 and a lower buffer surface 608. The lower buffer surface 608 is coincident site lattice-matched to the crystalline surface 604 as described previously.

The device 600 further includes a first device layer 612 fabricated with a first crystalline semiconductor material, and further includes a first device layer upper surface 614 and a first device layer lower surface 616. The first device layer lower surface 616 is coincident site lattice-matched to the upper buffer surface 610.

Additional layers of crystalline semiconductor material may be grown, deposited or otherwise provided on the first device layer upper surface 614 in order to produce semiconductor devices with the desired function. Non-limiting examples of semiconductor devices that may be formed using the methods described herein include photovoltaic solar cells, LEDs, lasers, transistors, and light detectors. Specific examples of semiconductor devices that may be fabricated using the method described herein are described below.

G. Solar Cells/Light Detectors

Figure 7A:
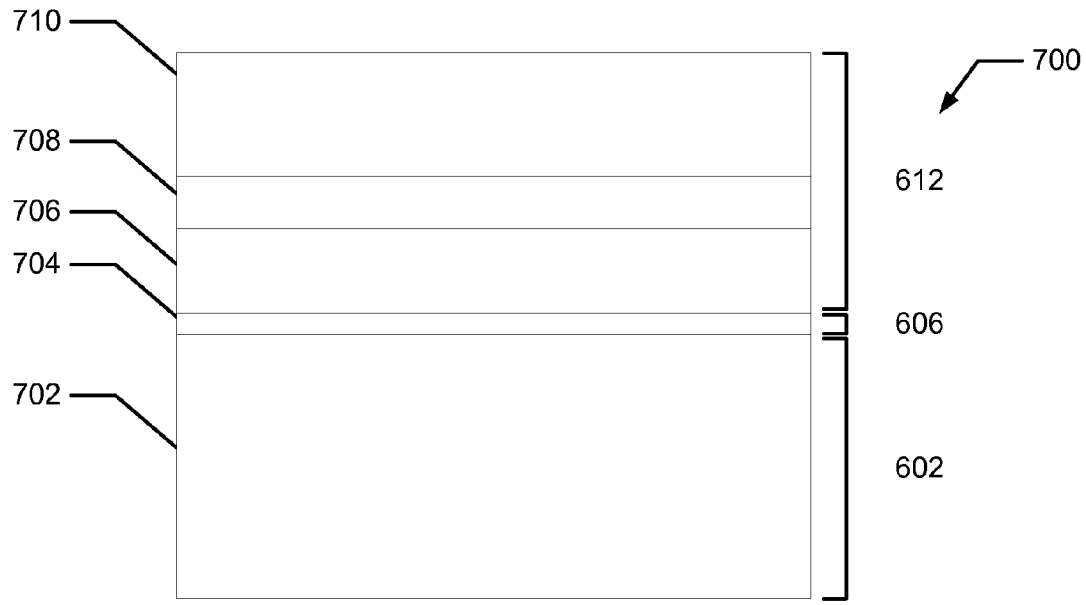
FIG. 7A is a schematic diagram of the layers of a triple-junction solar cell grown on a silicon substrate using a compliant aluminum buffer layer.

Multiple layers of semiconductors may be fabricated using the methods described herein to form a solar cell or light detector. FIG. 7 illustrates an example of a triple junction solar cell 700 that may be fabricated using the method described herein. The triple junction solar cell 700 may include an active Si substrate 702 with a band gap of about 1.1 eV, a relatively thin Al compliant buffer layer 704, a GaAs semiconductor layer 706 with a band gap of about 1.4 eV, a tunnel junction 708, and a GaInP semiconductor layer 710 with a band gap of about 1.9 eV. In this device 700, the Al buffer layer 704 is sufficiently thin to allow the passage of light through the buffer layer 704 to the substrate layer 702. For example, the transparent buffer layer 704 may range from about 3 nm and about 5 nm in thickness, and may further function as a tunnel junction.

Figure 7B:
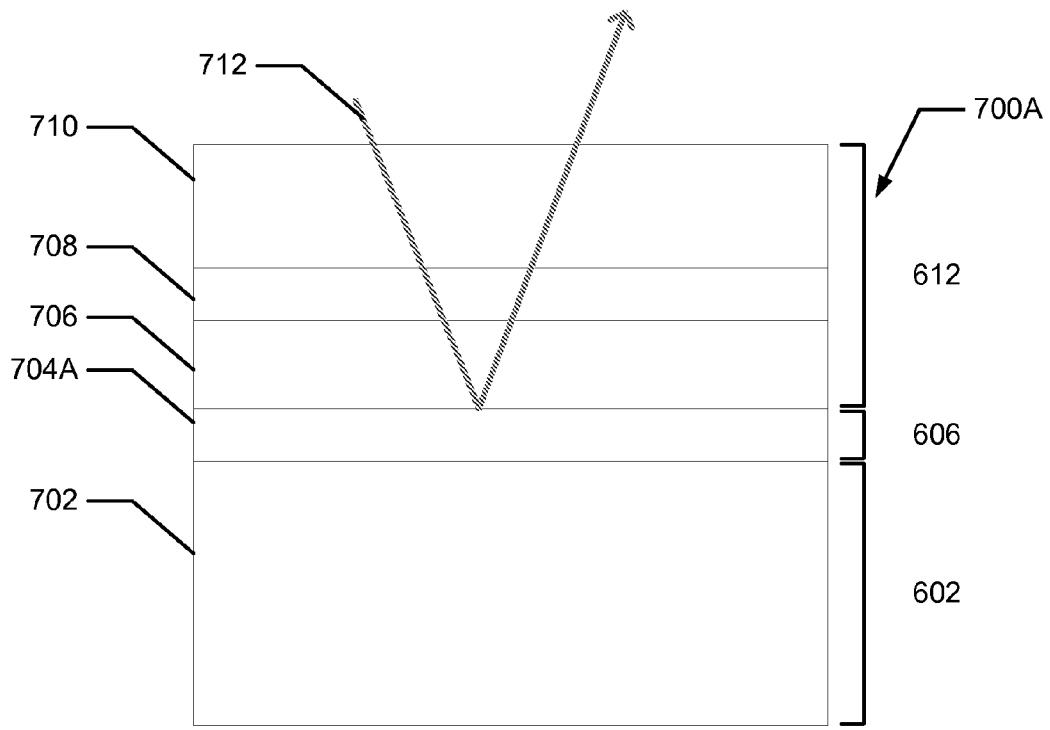
FIG. 7B is a schematic diagram of the layers of a two-junction solar cell grown on a silicon substrate using a compliant aluminum buffer layer.

A similar arrangement of materials may be used to produce a two-junction solar cell 700A, as shown in FIG. 7B. The two-junction solar cell 700A includes the identical materials arranged in an identical sequence, except that the aluminum buffer layer 704A is produced at a thickness that does not allow the passage of light through the buffer layer 704A. In this solar cell 700A, the aluminum buffer layer 704A acts as a reflector to reflect light 712 back through the solar cell 700A. Specifically, incoming light 712 passes through layers 710, 708, and 706, is reflected by the aluminum buffer layer 704, and passes through layers 706, 708, and 710 and out of the solar cell 700A. In the example shown, a portion of the light of different wavelengths is absorbed in the two junction layers, while some light is not absorbed initially, but is absorbed after reflection to generate an additional current. Because the light 712 passes through each layer two times, the semiconductor layers may be fabricated as much as about 50% thinner without a significant degradation of performance compared to a similarly constructed solar cell lacking a reflective aluminum buffer layer 704A.

b. Light Emitting Diode/Solid-State Laser

A single layer or multiple layers of crystalline semiconductor material may be fabricated using the method described herein to be used as a light emitting diode (LED) or a solid state laser. The LEDs produced using this method may be high efficiency and high performance due to the relatively low defect densities in the semiconductor materials. For purposes of illustration, Table 2 below summarizes common materials that may be formed using the method described herein for use in an LED or laser or other optics:

TABLE 2

Example Semiconductor Materials for LEDs

| Color | Wavelength | Semiconductor Materials |
|---|---|---|
| Infrared | $\lambda > 760$ | Gallium arsenide (GaAs) |
| | | Aluminum gallium arsenide (AlGaAs) |
| | | Indium gallium arsenide (InGaAs) |
| Red | $610 < \lambda < 760$ | Aluminum gallium arsenide (AlGaAs) |
| | | Gallium arsenide phosphide (GaAsP) |
| Orange | $590 < \lambda < 610$ | Gallium arsenide phosphide (GaAsP) |
| | | Aluminum gallium indium phosphide (AlGaInP) |
| | | Gallium phosphide (GaP) |
| Yellow | $570 < \lambda < 590$ | Gallium arsenide phosphide (GaAsP) |
| | | Aluminum gallium indium phosphide (AlGaInP) |
| | | Gallium phosphide (GaP) |
| Green | $500 < \lambda < 570$ | Indium gallium nitride (InGaN)/Gallium(III) nitride (GaN) |
| | | Gallium phosphide (GaP) |
| | | Aluminum gallium indium phosphide (AlGaInP) |
| | | Aluminum gallium phosphide (AlGaP) |
| Blue | $450 < \lambda < 500$ | Zinc selenide (ZnSe) |
| | | Indium gallium nitride (InGaN) |
| Violet | $400 < \lambda < 450$ | Indium gallium nitride (InGaN) |
| Ultraviolet | $\lambda < 400$ | Boron nitride (215 nm) |
| | | Aluminum nitride (AlN) (210 nm) |
| | | Aluminum gallium nitride (AlGaN) |
| | | Aluminum gallium indium nitride (AlGaInN) |

Figure 8:
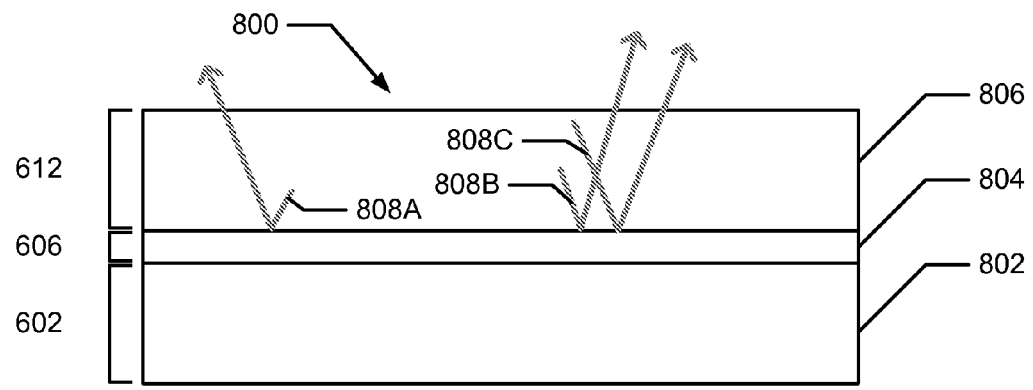
FIG. 8 is a schematic diagram of the layers of a light-emitting diode grown on a silicon substrate using a compliant aluminum buffer layer.

The arrangement of materials in an LED device 800 produced using the method described herein is illustrated in FIG. 8. The LED device 800 may include a substrate layer 802, a compliant buffer layer 804, and one or more layers of a semiconductor material 806 such as those described in Table 2 above. In one embodiment, the compliant buffer layer 804 may be a reflective material, such as aluminum. In this embodiment, the buffer layer 804 may function as an internal reflector to reflect any downward-directed light 808A-808C produced by the semiconductor material 806 in an upward direction to enhance the performance of the LED device 800. Similar internal reflectors may be incorporated into other devices such as solar cells as described above, or light detectors.

c. High Electron Mobility Transistor

Figure 9:
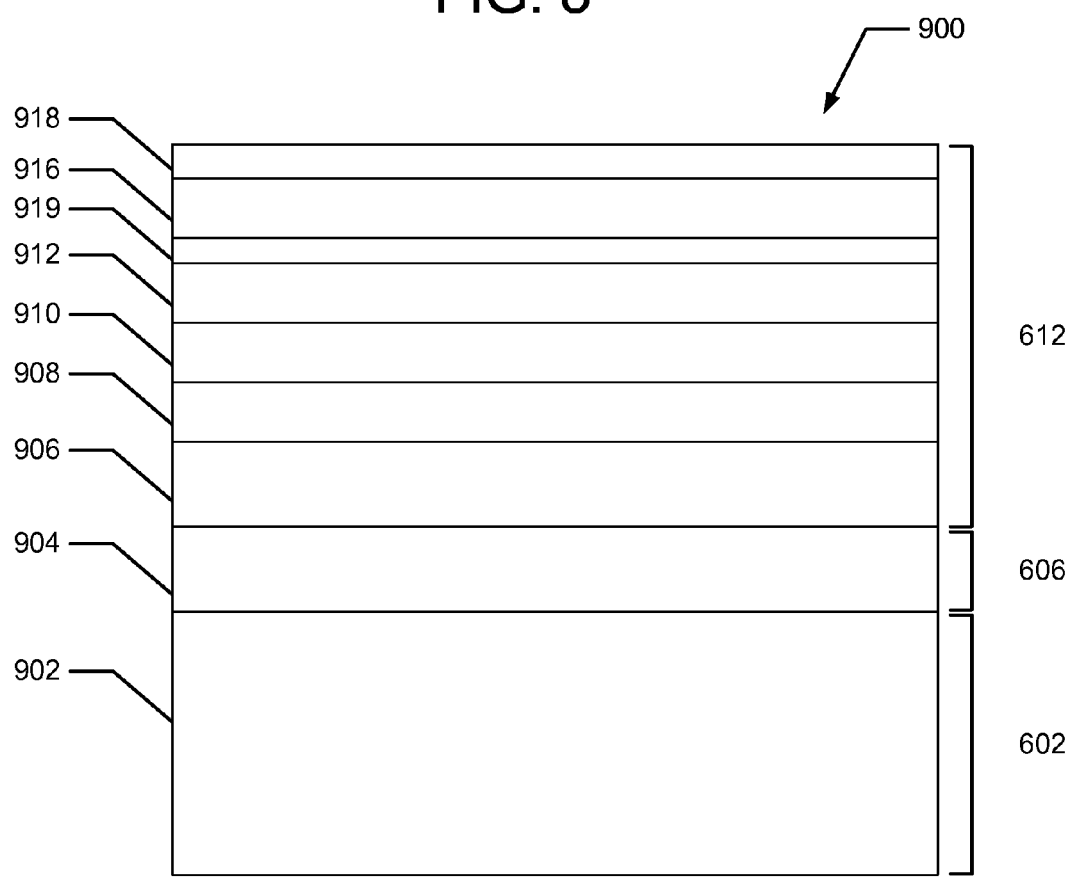
FIG. 9 is a schematic diagram of the layers of a high electron mobility transistor device grown on a silicon substrate using a compliant aluminum buffer layer.

The methods described herein may be used to produce a high electron mobility transistor (HEMT) 900 as shown in FIG. 9. The HEMT 900 may include a substrate 902 which may be (111) silicon and a compliant aluminum buffer layer 904. The HEMT 900 further includes an AlGaSb buffer layer 906, an AlSb bottom barrier layer 908, an InAs quantum well (QW) channel layer 910, an AlSb spacer layer 912, a thin delta-doped InAs quantum well (QW) layer 914, an AlSb top barrier layer, and an InAs top contact layer 918.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

The invention claimed is:

1. A semiconductor device comprising:
a Si substrate;
a compliant buffer layer comprising crystalline Al, wherein the compliant buffer layer is coincident site lattice-matched to the Si substrate, and the compliant buffer layer has a face-centered cubic structure; and
a device layer comprising a first crystalline semiconductor material chosen from III-V semiconductor materials, III-V semiconductor alloys, II-VI semiconductor materials, II-VI semiconductor alloys, Ge, SiGe, and group IV semiconductor alloys, wherein the device layer is coincident site lattice-matched to the compliant buffer layer.

2. The device of claim 1, wherein the device layer further comprises at least one additional crystalline semiconductor material chosen from III-V semiconductor materials, III-V semiconductor alloys, II-VI semiconductor materials, II-VI semiconductor alloys, Ge, SiGe, and group IV semiconductor alloys, wherein the at least one additional crystalline semiconductor material is lattice-matched to the first crystalline semiconductor material.

3. The device of claim 1 or claim 2, wherein the semiconductor device is chosen from a photovoltaic solar cell, a LED, a laser, a transistor, a high electron mobility transistor, and a light detector.

4. The device of claim 3, wherein the semiconductor device is a two-junction PV solar cell, the first crystalline semiconductor material comprises GaAs having a band gap of about 1.4 eV, and the at least one additional semiconductor material comprises GaInP having a band gap of about 1.9 eV.

5. The device of claim 3, wherein the semiconductor device is a three junction PV solar cell, the first crystalline semiconductor material comprises GaAs having a band gap of about 1.4 eV, the at least one additional semiconductor material comprises GaInP having a band gap of about 1.9 eV, and the Si substrate functions as a semiconductor material having a band gap of about 1.1 eV.

6. The device of claim 3, wherein the semiconductor device is an LED and the first crystalline semiconductor material comprises InGaN having a band gap ranging between about 1.9 eV and about 2.5 eV.

7. The device of claim 3, wherein the semiconductor device is a high electron mobility transistor, the first crystalline semiconductor material comprises an AlGaSb semiconductor material, and the at least one additional semiconductor material comprises:
- a first AlSb barrier layer lattice-matched on the AlGaSb semiconductor material;
- an InAs quantum well channel layer lattice-matched on the first AlSb layer;
- a second AlSb spacer layer lattice-matched on the InAs QW channel layer;
- a delta-doped InAs quantum well layer lattice-matched on the second AlSb spacer layer;
- a third AlSb barrier layer lattice-matched on the delta doped InAs quantum well layer; and,
- an InAs top contact layer lattice-matched on the second AlSb barrier layer.

8. The device of claim 1, wherein the compliant buffer layer consists essentially of crystalline Al.

9. The device of claim 1, wherein a ratio of a lattice constant of the compliant buffer layer to a lattice constant of the device layer is less than or equal to ¾.

10. The device of claim 1, wherein a ratio of a lattice constant of the compliant buffer layer to a lattice constant of the device layer is greater than or equal to $6(\sqrt{2})/7$.

* * * * *